(12) United States Patent
Tang et al.

(10) Patent No.: US 9,373,781 B2
(45) Date of Patent: Jun. 21, 2016

(54) DUAL PERPENDICULAR MAGNETIC ANISOTROPY MAGNETIC JUNCTION USABLE IN SPIN TRANSFER TORQUE MAGNETIC RANDOM ACCESS MEMORY APPLICATIONS

(71) Applicant: Samsung Electronics Co., LTD., Gyeonggi-do (KR)

(72) Inventors: Xueti Tang, San Jose, CA (US); Jang Eun Lee, Cupertino, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/184,684

(22) Filed: Feb. 19, 2014

(65) Prior Publication Data
US 2015/0129997 A1 May 14, 2015

Related U.S. Application Data

(60) Provisional application No. 61/902,872, filed on Nov. 12, 2013.

(51) Int. Cl.
| | |
|---|---|
| *H01L 43/12* | (2006.01) |
| *H01L 43/08* | (2006.01) |
| *H01L 27/22* | (2006.01) |
| *G11C 11/16* | (2006.01) |
| *G11B 5/39* | (2006.01) |

(52) U.S. Cl.
CPC .............. *H01L 43/12* (2013.01); *H01L 27/226* (2013.01); *H01L 43/08* (2013.01); *G11B 2005/3996* (2013.01); *G11C 11/16* (2013.01); *Y10T 29/49034* (2015.01)

(58) Field of Classification Search
None
See application file for complete search history.

(56) References Cited

U.S. PATENT DOCUMENTS

| | | | |
|---|---|---|---|
| 6,747,852 B2 * | 6/2004 | Lin et al. | 360/324.12 |
| 6,967,863 B2 | 11/2005 | Huai | |
| 7,241,631 B2 | 7/2007 | Huai et al. | |
| 7,430,135 B2 | 9/2008 | Huai et al. | |
| 7,884,403 B2 | 2/2011 | Yuasa | |
| 7,973,351 B2 | 7/2011 | Marukame et al. | |
| 8,057,925 B2 | 11/2011 | Horng et al. | |
| 8,058,696 B2 | 11/2011 | Ranjan et al. | |
| 8,059,374 B2 | 11/2011 | Zhao et al. | |
| 8,191,235 B2 | 6/2012 | Takahashi et al. | |

(Continued)

OTHER PUBLICATIONS

Huai, Y.; Pakala, M.; Diao, Z.; Ding, Y., "Spin transfer switching current reduction in magnetic tunnel junction based dual spin filter structures," Applied Physics Letters, vol. 87, No. 22, 222510, pp. 1-3, Nov. 2005.

(Continued)

*Primary Examiner* — Craig A. Renner
(74) *Attorney, Agent, or Firm* — Convergent Law Group LLP

(57) ABSTRACT

A method for providing a dual magnetic junction usable in a magnetic device and the dual magnetic junction are described. First and second nonmagnetic spacer layers, a free layer and pinned are provided. The first pinned layer, free layer and nonmagnetic spacer layer may be annealed at an anneal temperature of at least three hundred fifty degrees Celsius before a second pinned layer is provided. The second pinned layer may include Co, Fe and Tb. The nonmagnetic spacer layers are between the pinned layers and the free layer. The magnetic junction is configured such that the free layer is switchable between a plurality of stable magnetic states when a write current is passed through the magnetic junction.

13 Claims, 10 Drawing Sheets

(56) References Cited

U.S. PATENT DOCUMENTS

| | | |
|---|---|---|
| 8,406,045 B1 | 3/2013 | Chen et al. |
| 8,422,285 B2 | 4/2013 | Apalkov et al. |
| 8,470,462 B2 | 6/2013 | Horng et al. |
| 8,492,169 B2 | 7/2013 | Cao et al. |
| 2006/0176735 A1 | 8/2006 | Yuasa |
| 2007/0019337 A1 | 1/2007 | Apalkov et al. |
| 2007/0258170 A1 | 11/2007 | Yuasa |
| 2009/0229111 A1 | 9/2009 | Zhao et al. |
| 2009/0246890 A1 | 10/2009 | Gill et al. |
| 2010/0073828 A1 | 3/2010 | Wang et al. |
| 2010/0183902 A1 | 7/2010 | Kim et al. |
| 2011/0014500 A1 | 1/2011 | Horng et al. |
| 2012/0155156 A1 | 6/2012 | Watts et al. |
| 2013/0005051 A1 | 1/2013 | Hu et al. |
| 2013/0005052 A1 | 1/2013 | Hu et al. |
| 2013/0028013 A1 | 1/2013 | Ikeda et al. |
| 2013/0071954 A1 | 3/2013 | Zhou et al. |
| 2013/0154034 A1* | 6/2013 | Apalkov et al. ............... 257/421 |
| 2013/0154035 A1 | 6/2013 | Krounbi et al. |
| 2013/0154036 A1 | 6/2013 | Tang et al. |
| 2013/0155754 A1 | 6/2013 | Apalkov et al. |
| 2013/0215672 A1 | 8/2013 | Zhou et al. |
| 2013/0230741 A1 | 9/2013 | Wang et al. |
| 2015/0028439 A1 | 1/2015 | Kula et al. |
| 2015/0048464 A1* | 2/2015 | Park et al. ..................... 257/421 |

OTHER PUBLICATIONS

Jan, G.; Wang, Y.; Moriyama, T.; Lee, Y.; Lin, M.; Zhong, T.; Tong, R.; Torng, T.; Wang, P., "High spin torque efficiency of magnetic tunnel junctions with MgO/CoFeB/MgO free layer," Applied Physics Express, vol. 5, No. 9, 093008, pp. 1-3, 2012.

Jung, J.H.; Lim, S.H.; Lee, S.R., "Strong perpendicular magnetic anisotropy in thick CoFeB films sandwiched by Pd and MgO layers," Applied Physics Letters, vol. 96, No. 4, 042503, pp. 1-3, Jan. 2010.

Rahman, M.T.; Lyle, A.; Amiri, P.K.; Harms, J.; Glass, B.; Zhao, H.; Rowlands, G.; Katine, J.A.; Langer, J.; Krivorotov, I.N.; Wang, K.L.; Wang, J.P, "Reduction of switching current density in perpendicular magnetic tunnel junctions by tuning the anisotropy of the CoFeB free layer," Journal of Applied Physics, vol. 111, No. 7, 07C907, pp. 1-3, Apr. 2012.

* cited by examiner

DUAL PERPENDICULAR MAGNETIC ANISOTROPY MAGNETIC JUNCTION USABLE IN SPIN TRANSFER TORQUE MAGNETIC RANDOM ACCESS MEMORY APPLICATIONS

CROSS-REFERENCE TO RELATED APPLICATIONS

This application claims the benefit of provisional Patent Application Ser. No. 61/902,872, filed Nov. 12, 2013, entitled DUAL PERPENDICULAR MAGNETIC ANISOTROPY FREE LAYER MAGNETIC JUNCTION USABLE IN SPIN TRANSFER TORQUE MAGNETIC RANDOM ACCESS MEMORY APPLICATIONS, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and top contact 22 may be used to drive current through the conventional MTJ 10. The conventional MTJ, uses conventional seed layer(s) (not shown), may include capping layers (not shown) and may include a conventional antiferromagnetic (AFM) layer (not shown). The conventional magnetic junction 10 includes a conventional pinned layer 16, a conventional tunneling barrier layer 18, and a conventional free layer 20. Also shown is top contact 22. Conventional contacts 14 and 22 are used in driving the current in a current-perpendicular-to-plane (CPP) direction, or along the z-axis as shown in FIG. 1. Typically, the conventional pinned layer 16 is closest to the substrate 12 of the layers 16, 18 and 20.

The conventional pinned layer 16 and the conventional free layer 20 are magnetic. The magnetization 17 of the conventional pinned layer 16 is fixed, or pinned, in a particular direction. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic.

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as perpendicular-to-plane, the magnetization 21 of the conventional free layer 20 may be in plane. Thus, the pinned layer 16 and free layer 20 may have their magnetizations 17 and 21, respectively oriented perpendicular to the plane of the layers.

To fabricate the conventional magnetic junction 10, the layers 16, 18 and 20 are deposited. After the layer 16, 18 and 20 has been provided, the magnetic junction 10 is annealed. This annealing assists in the crystallization of the conventional tunneling barrier 18, which may be amorphous as-deposited. The layers for the conventional magnetic junction 10 are then milled to define the edges of the conventional magnetic junction 10.

To switch the magnetization 21 of the conventional free layer 20, a current is driven perpendicular to plane (in the z-direction). When a sufficient current is driven from the top contact 22 to the bottom contact 14, the magnetization 21 of the conventional free layer 20 may switch to be parallel to the magnetization 17 of the conventional pinned layer 16. When a sufficient current is driven from the bottom contact 11 to the top contact 22, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. For example, mechanisms for improving the performance of STT-RAM are desired. Accordingly, what is needed is a method and system that may improve the performance of the spin transfer torque based memories. The method and system described herein address such a need.

BRIEF SUMMARY OF THE INVENTION

A method for providing a dual magnetic junction usable in a magnetic device and the dual magnetic junction are described. First and second nonmagnetic spacer layers, a free layer and pinned are provided. The first pinned layer, free layer and nonmagnetic spacer layer may optionally be annealed at an anneal temperature of at least three hundred fifty degrees Celsius before a second pinned layer is provided. The second pinned layer may optionally include Co, Fe and Tb. The nonmagnetic spacer layers are between the pinned layers and the free layer. The magnetic junction is configured such that the free layer is switchable between a plurality of stable magnetic states when a write current is passed through the magnetic junction.

DETAILED DESCRIPTION OF THE INVENTION

Figure 1:
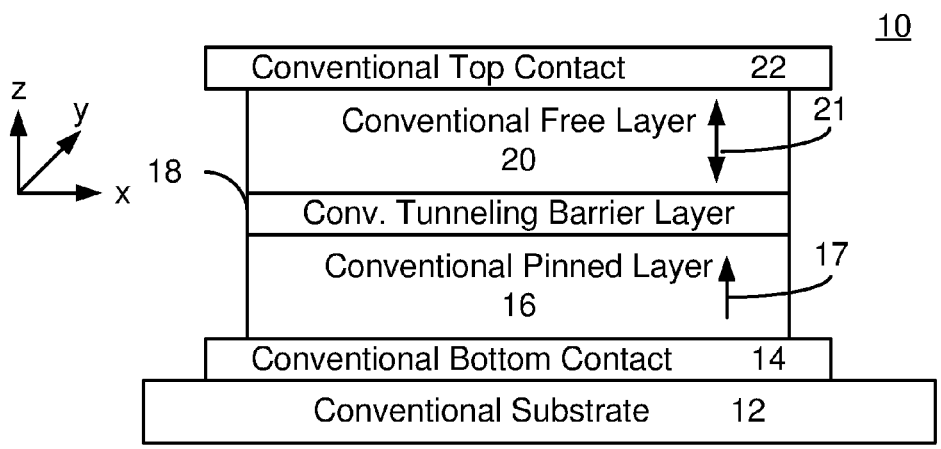
FIG. 1 depicts a conventional magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a dual magnetic junction as well as a magnetic memory utilizing the dual magnetic junction are described. First and second nonmagnetic spacer layers, a free layer and pinned are provided. The first pinned layer, free layer and nonmagnetic spacer layer may optionally be annealed at an anneal temperature of at least three hundred fifty degrees Celsius before a second pinned layer is provided. The second pinned layer may optionally include Co, Fe and Tb. The nonmagnetic spacer layers are between the pinned layers and the free layer. The magnetic junction is configured such that the free layer is switchable between a plurality of stable magnetic states when a write current is passed through the magnetic junction.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2:
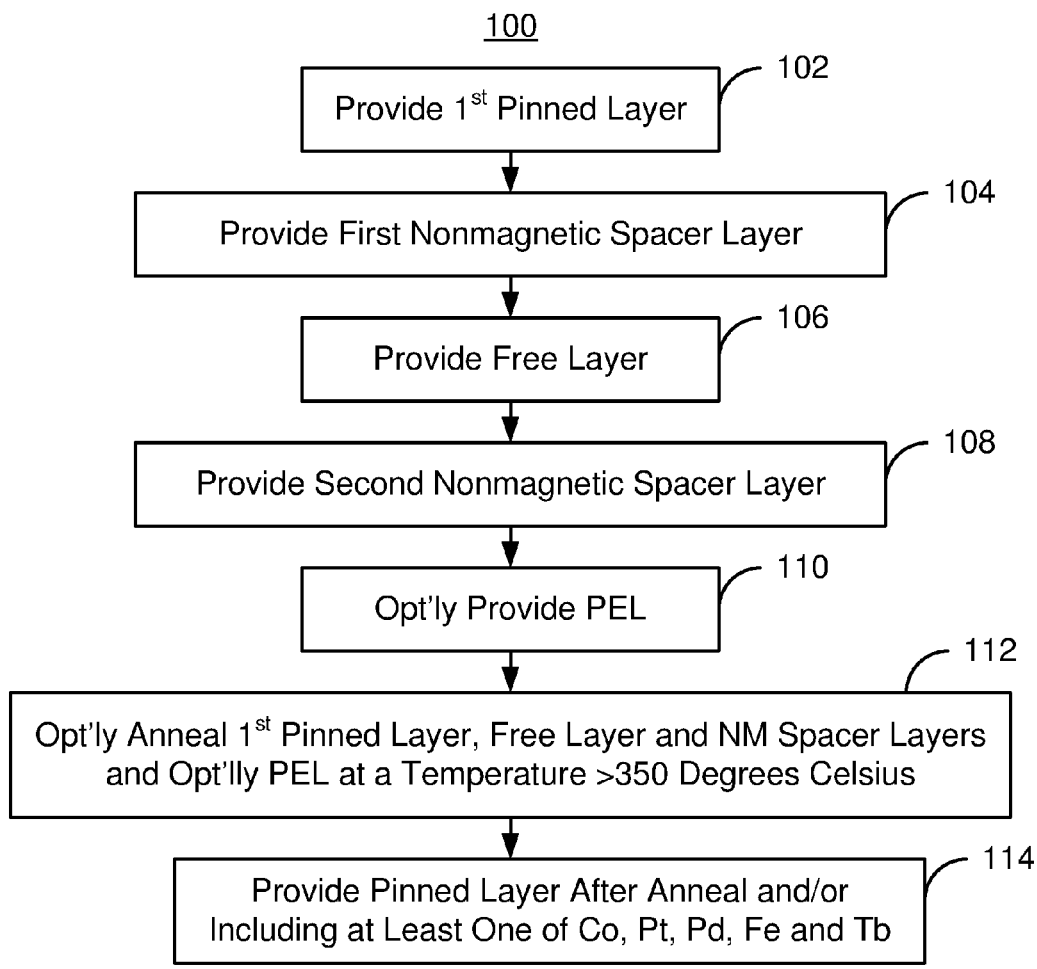
FIG. 2 depicts an exemplary embodiment of a method for providing a dual magnetic junction usable in a magnetic memory and programmable using spin transfer torque.

FIG. 2 depicts an exemplary embodiment of a method 100 for fabricating a magnetic junction usable in a magnetic device such as a spin transfer torque random access memory (STT-RAM) and, therefore, in a variety of electronic devices. For simplicity, some steps may be omitted, performed in another or combined. Further, the method 100 may start after other steps in forming a magnetic memory have been performed.

A first pinned layer is provided on the substrate, via step 102. In some embodiments, step 102 may be performed after seed, contact and/or other structures have been provided. The seed layer(s) may be selected for various purposes including but not limited to the desired crystal structure of the first pinned layer, magnetic anisotropy and/or magnetic damping of the first pinned layer. The edges of the magnetic junction, including those of the free layer, may be defined immediately after deposition or at a later time. For example, once the remaining layers of the magnetic junction have been deposited, the magnetic junction may be defined. In some embodiments, an ion mill may be performed. Thus, portions of step 102 may be spread out over time. The first pinned layer is magnetic and may have its magnetization pinned, or fixed, in a particular direction during at least a portion of the operation of the dual magnetic junction. The first pinned layer may thus be thermally stable at operating temperatures. Step 102 may include depositing magnetic material(s) such as Co, Ni, and Fe as well as nonmagnetic materials.

The first pinned layer formed in step 102 may be a simple (single) layer or may include multiple layers. For example, the first pinned layer may be a synthetic antiferromagnetic (SAF) layer that includes ferromagnetic layers that are interleaved with nonmagnetic layers, such as Ru. Each of the ferromagnetic layers may itself by a multilayer. In addition, other multilayers may be provided in step 102. The pinned layer formed in step 102 may also have a perpendicular anisotropy energy that exceeds the out-of-plane demagnetization energy. Thus, the pinned layer may have its magnetic moment oriented perpendicular to plane. For example, the first pinned layer provided in step 102 may include Co/Pd multilayer(s), Co/Pt multilayer(s), CoPt alloys, Fe/Pt multilayer(s), Tb/CoFe multilayer(s), TbCoFe alloy(s), TbCo/Fe multilayer(s), TbCo/FeB multilayer(s), Co/Ni multilayer(s), CoFeB and/or other materials that have a high perpendicular anisotropy. Other orientations of the magnetization of the pinned layer are possible. In addition, it is noted that other layers, such as a polarization enhancement layer (PEL) or coupling layer(s) may be inserted between the first pinned layer and the first nonmagnetic spacer layer.

A first nonmagnetic spacer layer is provided, via step 104. Step 104 may include depositing MgO, which forms a tunneling barrier layer. In some embodiments, step 104 may include depositing MgO using, for example, radio frequency (RF) sputtering. In other embodiments, metallic Mg may be deposited, then oxidized in step 104. As discussed above with respect to step 102, the edges of the first nonmagnetic spacer layer may be defined at a later time, for example after deposition of the remaining layer of the magnetic junction.

A free layer is provided on the substrate, via step 106. In some embodiments, step 106 includes depositing the material(s) for the free layer on the nonmagnetic spacer layer provided in step 104. As discussed above with respect to step 102, the edges of the free layer may be defined at a later time, for example after deposition of the remaining layer of the magnetic junction.

The free layer provided in step 106 is magnetic and thermally stable at operating temperatures. In some embodiments, the free layer provided in step is a multilayer. For example, the free layer maybe a synthetic antiferromagnet (SAF) and/or may include multiple adjoining ferromagnetic layers that are exchange or otherwise magnetically coupled. Further, in some embodiments, the perpendicular magnetic anisotropy energy of the free layer provided in step 106 exceeds the out-of-plane demagnetization energy. The magnetic moment of the free layer may thus be out-of-plane, including perpendicular-to-plane. In such embodiments, the free layer may include multilayers such as high interfacial anisotropy materials interleaved with coupling layers. In addition, a polarization enhancement layer (PEL) may be provided as part of or in addition to the free layer. A PEL includes high spin polarization materials. Materials deposited in step 106 may include Fe, Co, Ni, Ru, W and/or other material(s). For example, step 106 may include providing W/CoFeB bilayer(s), Ta/CoFeB bilayer(s), CoFeB/W/CoFeB trilayer(s). These multilayers may also be repeated. In other embodiments, the free layer may include one or more of a CoFeB/W/CoFeB multilayer, a CoFeB/Ta/CoFeB multilayer, a CoFeB/Hf/CoFeB multilayer, a CoFeB/V/CoFeB multilayer, a CoFeB/W/Fe/W/CoFeB multilayer, a CoFeB/(CoFeTb)$_i$/CoFeB multilayer where i is an integer of at least one, A CoFeB/(CoFeGe)$_j$/CoFeB multilayer where j is an integer of at least one, and a Co/FeB/(CoFeGd)$_n$/CoFeB multilayer where n is an integer of at least one. Thus, the free layer may include materials, such as CoFeB, which have a high interfacial perpendicular anisotropy (I-PMA). The free layer provided in step 106 may also include materials such as Ge, Gd and/or Tb multilayers and alloys which have a high bulk perpendicular magnetic anisotropy (B-PMA). In some embodiments, the free layer may include both high I-PMA and high B-PMA materials. In some embodiments, the high B-PMA material(s) may be amorphous as-deposited. This may facilitate growth of a second nonmagnetic spacer layer, such as crystalline MgO, as discussed below. An insertion layer, such as Fe or W may also be provided in addition to or as part of the free layer. The free layer provided in step 106 is also configured to be switched between stable magnetic states when a write current is passed through the magnetic junction. Thus, the free layer is switchable utilizing spin transfer torque.

A second nonmagnetic spacer layer is provided, via step 108. Step 108 may include depositing MgO, which forms a tunneling barrier layer. In some embodiments, step 108 may include depositing MgO using, for example, RF sputtering. In other embodiments, metallic Mg may be deposited, then oxidized in step 108. As discussed above with respect to step 102, the edges of the nonmagnetic spacer layer may be defined at a later time, for example after deposition of the remaining layer of the magnetic junction.

A PEL may optionally be provided, via step 110. The PEL is desired to have a high spin polarization. For example, step 110 may include providing CoFeB, FeB, a bilayer including a Fe layer and a CoFeB layer, a Fe/FeB bilayer, a CoFeBTa/CoFeB bilayer, and a CoFeB/W/Fe/W/CoFeB multilayer, a half metallic material and/or a Heusler alloy. As discussed above with respect to step 102, the edges of the PEL may be defined at a later time, for example after deposition of the remaining layer of the dual magnetic junction.

The nonmagnetic spacer layers provided in steps 104 and 108 may be amorphous as-deposited. However, the nonmagnetic spacer layer is desired to be crystalline. For example, crystalline MgO with a (100) orientation may be desired for enhanced tunneling magnetoresistance (TMR) of the magnetic junction. Consequently, the portion of the magnetic junction that has already been formed may optionally be annealed at a temperature of at least three hundred fifty degrees Celsius before the second pinned layer is provided in step 114, described below. Thus, at least the first pinned layer, the free layer formed and the nonmagnetic spacer layers may be annealed, via step 112. In some embodiments, step 112 includes performing a rapid thermal anneal (RTA). In such an embodiments, the already-formed portion of the magnetic junction may reach the anneal temperature in minutes or less. However, in other embodiments, the anneal may be performed in another manner, including but not limited to block heating. In some embodiments, the portion of the magnetic junction may be annealed in step 106 for at least one hour and not more than ten hours. Further, in some embodiments, higher anneal temperatures may be used. However, in such embodiments, the first pinned layer provided in step 102 may be desired to be thermally robust. Stated differently, the magnetic and other desired properties of the first pinned layer formed in step 102 may be desired to be unchanged or at least not unduly changed by the anneal. The anneal temperature may be desired not to exceed six hundred degrees Celsius. In some embodiments, the anneal is performed at a temperature of at least four hundred degrees Celsius. In some such embodiments, the anneal temperature is at least for hundred fifty degrees Celsius. The anneal temperature in some embodiments may be desired not to exceed five hundred degrees Celsius. However, in other embodiments, lower anneal temperatures may be used. For example, the anneal temperature may be at least three hundred and not more than four hundred degrees Celsius. Such lower temperatures may be used if the first pinned layer provided in step 102 is not thermally robust and/or if the anneal in step 112 is performed after step 114 and the second pinned layer is not thermally robust. Further, the anneal performed in step 112 may be broken into multiple annealing steps. For example, a first annealing step may be performed before the PEL is optionally provided in step 110. A second annealing step may be performed after the PEL is provided, but before the pinned layer is provided in step 114.

A second pinned layer is provided, optionally after the annealing step, via step 114. Step 114 may include depositing magnetic material(s) such as Co, Ni, and Fe as well as nonmagnetic materials. As discussed above, portions of step 114 may be spaced apart in time. Thus, the second nonmagnetic spacer layer is between the second pinned layer and the free layer. As discussed above with respect to step 102, the edges of the second pinned layer may be defined at a later time, for example after deposition of the remaining layer of the magnetic junction. The second pinned layer is magnetic and may have its magnetization pinned, or fixed, in a particular direction during at least a portion of the operation of the magnetic junction. The second pinned layer may thus be thermally stable at operating temperatures. The second pinned layer formed in step 114 may be a simple (single) layer or may include multiple layers. For example, the second pinned layer formed in step 114 may be a SAF including magnetic layers antiferromagnetically or ferromagnetically coupled through thin nonmagnetic layer(s), such as Ru. In such a SAF, each magnetic layer may also include multiple layers. The second pinned layer may also be another multilayer. The second pinned layer may have a perpendicular anisotropy energy that exceeds the out-of-plane demagnetization energy. Thus, the pinned layer may have its magnetic moment oriented perpendicular to plane. In such embodiments, Co/Pd multilayer(s), Co/Pt multilayer(s), CoPt alloys, Fe/Pt multilayer(s), Tb/CoFe multilayer(s), TbCoFe alloy(s) Co/Ni multilayer(s), CoFeB and/or other materials may be provided in step 114. Other orientations of the magnetization of the pinned layer are possible. It is also noted that other layers, such as a PEL discussed above or coupling layer(s) may be inserted between the second pinned layer and the second nonmagnetic spacer layer.

Figure 3:
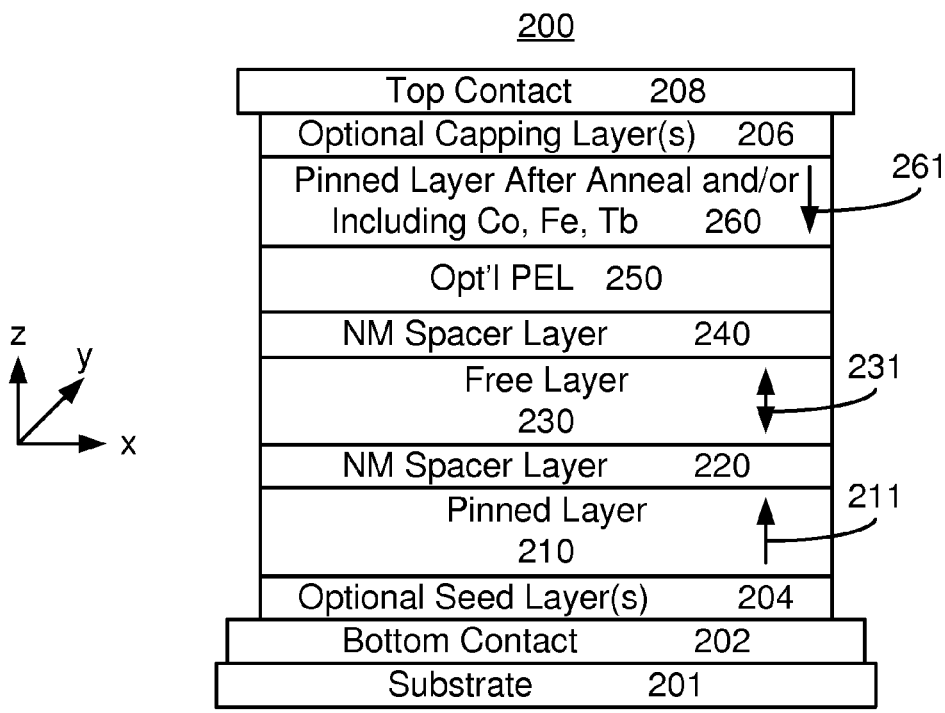
FIG. 3 depicts an exemplary embodiment of a dual magnetic junction usable in a magnetic memory programmable using spin transfer torque.

FIG. 3 depicts an exemplary embodiment of a magnetic junction 200 that may be fabricated using the method 100, as well as surrounding structures. For clarity, FIG. 3 is not to scale. The magnetic junction 200 may be used in a magnetic device such as a STT-RAM and, therefore, in a variety of electronic devices. The magnetic junction 200 includes a first pinned layer 210 having a magnetic moment 211, a first nonmagnetic spacer layer 220, a free layer 230 having magnetic moment 231, a second nonmagnetic spacer layer 240, an optional PEL 250 and a second pinned layer 260 having magnetic moment 261. Also shown is an underlying substrate 201 in which devices including but not limited to a transistor may be formed. Bottom contact 202, top contact 208, optional seed layer(s) 204 and optional capping layer(s) 206 are also shown. As can be seen in FIG. 3, the second pinned layer 260 is closer to the top (furthest from a substrate 201) of the magnetic junction 200, and may be formed after an anneal. Further, the second pinned layer 260 may include Co, Fe, and Tb. An optional pinning layer (not shown) may be used to fix the magnetization (not shown) of the pinned layers 210 and/or 260. In some embodiments, the optional pinning layer may be an AFM layer or multilayer that pins the magnetization (not shown) of the pinned layer(s) 210/260 by an exchange-bias interaction. However, in other embodiments, such as those shown in the drawings the optional pinning layer may be omitted or another structure may be used. The PEL 250 may include one or more of CoFeB, FeB, a bilayer including a Fe layer and a CoFeB layer, a Fe/FeB bilayer, a CoFeBTa/CoFeB bilayer, and a CoFeB/W/Fe/W/CoFeB multilayer, a half metallic material and a Heusler alloy. In addition, another PEL and/or coupling layer(s) (not shown) may be inserted between the first pinned layer 210 and the first nonmagnetic spacer layer 220.

The perpendicular magnetic anisotropy energies of the pinned layers 210 and 260 and of the free layer 230 each exceeds the out of plane demagnetization energies of the pinned layers 210 and 260 and free layer 230. Consequently, the magnetic moments 211, 231 and 261 may be perpendicular to plane. In some embodiments, the free layer 230 may include amorphous B-PMA material(s) and/or an I-PMA material(s). For example, the free layer may include at least one of a CoFeB/W/CoFeB multilayer, a CoFeB/Ta/CoFeB multilayer, a CoFeB/Hf/CoFeB multilayer, a CoFeB/V/CoFeB multilayer, a CoFeB/W/Fe/W/CoFeB multilayer, a CoFeB/(CoFeTb)$_i$/CoFeB multilayer where i is an integer of at least one, A CoFeB/(CoFeGe)$_j$/CoFeB multilayer where j is an integer of at least one, a Co/FeB/(CoFeGd)$_n$/CoFeB multilayer where n is an integer of at least one. The magnetic junction 200 is also configured to allow the free layer 230 to be switched between stable magnetic states when a write current is passed through the magnetic junction 200. Thus, the free layer 230 is switchable utilizing spin transfer torque. The pinned layer(s) 210 and 260 may also include materials such as CoFeTb, CoFe/Tb bilayer(s), Co/Pt bilayer(s), CoPd bilayer(s), CoFeB and analogous high perpendicular magnetic anisotropy structures. One or more of the layers 210, 230 and/or 260 may also be multilayers including but not limited to SAFs.

The magnetic junction 200 and free layer 230 may have improved performance. Because an anneal may be performed in step 112 before the second pinned layer is provided in step 114, a higher anneal temperature may be used. As a result, the nonmagnetic spacer layers 220 and 240 may be better crystallized and have a texture more highly oriented in the desired direction. For example, improved crystalline MgO nonmagnetic spacer layers 220 and/or 240 may have more of the films oriented in the 200. Consequently, a higher magnetoresistance may be achieved. Further, the selection of materials for the pinned layer 260 may be broadened. Thus, materials that may be adversely affected by a higher temperature anneal may be used for the second pinned layer 260. Again, tunneling magnetoresistance (TMR) may be enhanced. The structure, composition and film quality of the second pinned layer may also be improved. For example, unwanted lattice restructuring and compositional changes such as diffusion and the emergence of alternate phases may be reduced or avoided. Co, Fe and Tb may also be used in the pinned layer 260. Thus, smaller stray fields from the pinned layer 260 may exert a smaller field on the free layer 230. In addition, the dual magnetic junction 200 may have the magnetic moments 211 and 261 in the dual state (antiparallel) as shown in FIG. 2. For such an embodiment, the spin transfer torque is enhanced. As a result, a lower write current may be used to program the dual magnetic junction 200. Thus, power consumption in a memory using the magnetic junction 200 may be reduced.

Figure 4:
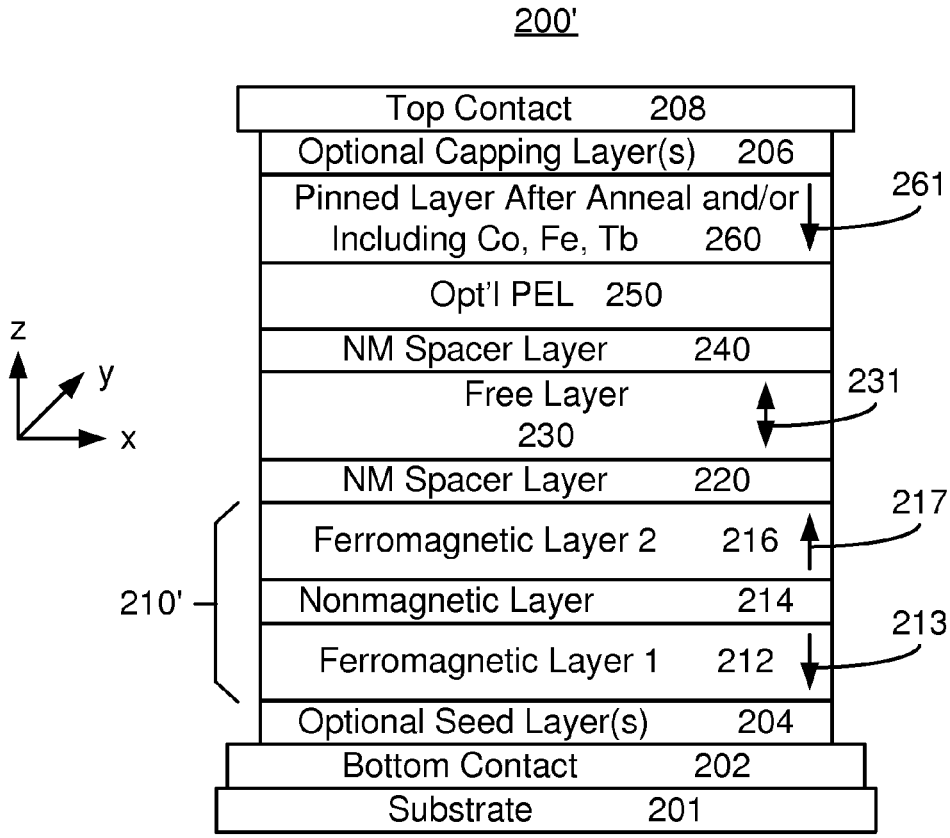
FIG. 4 depicts another exemplary embodiment of a dual magnetic junction usable in a magnetic memory programmable using spin transfer torque.

FIG. 4 depicts an exemplary embodiment of a magnetic junction 200' that may be fabricated using the method 100, as well as surrounding structures. For clarity, FIG. 4 is not to scale. The magnetic junction 200' may be used in a magnetic device such as a STT-RAM and, therefore, in a variety of electronic devices. The magnetic junction 200' is analogous to the magnetic junction 200. Consequently, similar components have analogous labels. The magnetic junction 200' includes a first pinned layer 210', a first nonmagnetic spacer layer 220, a free layer 230 having magnetic moment 231, a second nonmagnetic spacer layer 240, an optional PEL 250 and a second pinned layer 260 having magnetic moment 261 that are analogous to the pinned layer 210, the first nonmagnetic spacer layer 220, the free layer 230 having magnetic moment 231, the second nonmagnetic spacer layer 240, optional PEL 250 and the second pinned layer 260 having magnetic moment 261 depicted in the magnetic junction 200. Also shown is an underlying substrate 201, bottom contact 202, top contact 208, optional seed layer(s) 204 and optional capping layer(s) 206 that are analogous to the substrate 201, bottom contact 202, top contact 208, optional seed layer(s) 204 and optional capping layer(s) 206 for the magnetic junction 200. Optional pinning layer(s) (not shown) may be used to fix the magnetization (not shown) of the pinned layer(s) 210 and/or 260. In some embodiments, the optional pinning layer may be an AFM layer or multilayer that pins the magnetization (not shown) of the pinned layer 210/260 by an exchange-bias interaction. However, in other embodiments, the optional pinning layer may be omitted or another structure may be used.

The perpendicular magnetic anisotropy energies of the pinned layers 210 and 260 and of the free layer 230 each exceeds the out of plane demagnetization energies of the pinned layers 210 and 260 and free layer 230, respectively. Consequently, the magnetic moments 231 and 261 of the free layer 230 and the pinned layer 260, respectively, may be perpendicular to plane. In addition, the first pinned layer 210' is a SAF including ferromagnetic layers 212 and 216 separated by a nonmagnetic layer 214, such as Ru. The perpendicular magnetic anisotropies of the ferromagnetic layers 212 and 216 exceeds their out-of-plane demagnetization energies. Thus, the magnetic moments 213 and 217 are depicted as perpendicular-to-plane. The magnetic junction 200 is also configured to allow the free layer 230 to be switched between stable magnetic states when a write current is passed through the magnetic junction 200. Thus, the free layer 230 is switchable utilizing spin transfer torque.

The dual magnetic junction 200' may have improved performance. In particular, the dual magnetic junction 200' may share the benefits of the magnetic junction 200. Because the anneal(s) may be performed in step 112 before the pinned layer is provided in step 114, a higher anneal temperature may be used and/or different materials may be used for the second pinned layer 260. As a result, a higher magnetoresistance may be achieved. Co, Fe and Tb may also be used in the pinned layer 260. Thus, smaller stray fields from the pinned layer 260 may exert a smaller field on the free layer 230. Because the dual magnetic junction 200' is in the dual state, a lower write current may also be used. Thus, performance of the magnetic junction 200' may be improved.

Figure 5:
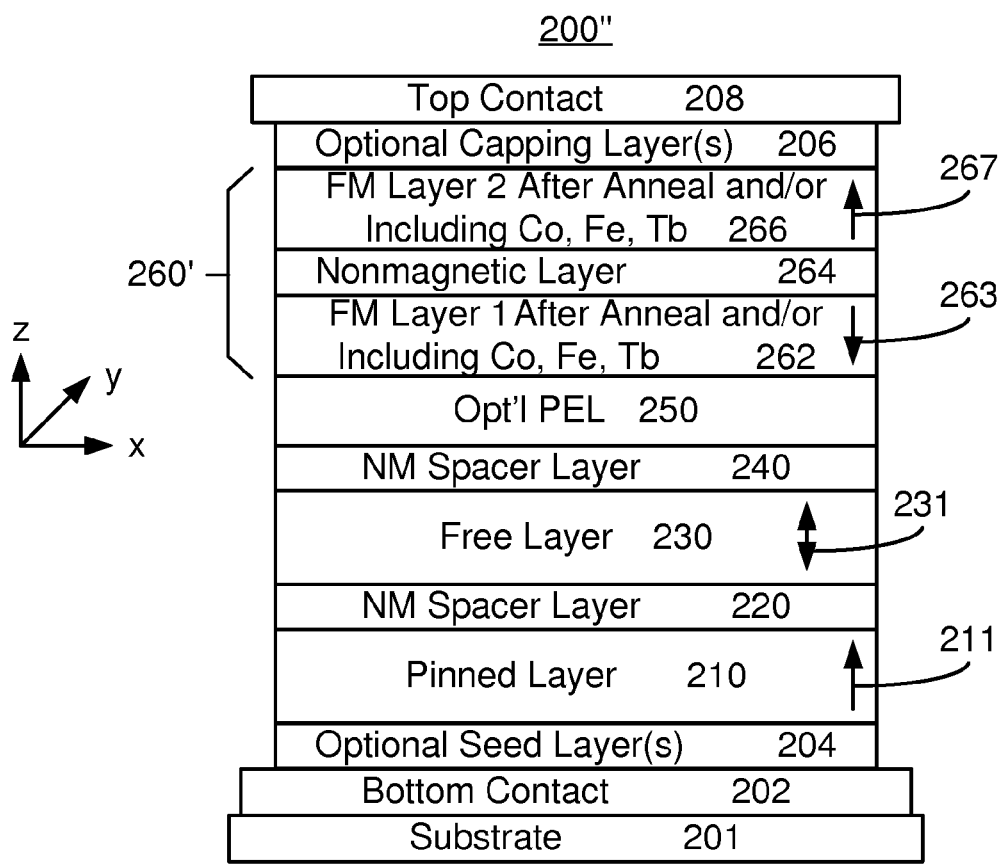
FIG. 5 depicts another exemplary embodiment of a dual magnetic junction usable in a magnetic memory programmable using spin transfer torque.

FIG. 5 depicts an exemplary embodiment of a magnetic junction 200" that may be fabricated using the method 100, as well as surrounding structures. For clarity, FIG. 5 is not to scale. The magnetic junction 200" may be used in a magnetic device such as a STT-RAM and, therefore, in a variety of electronic devices. The magnetic junction 200" is analogous to the magnetic junction(s) 200 and/or 200'. Consequently, similar components have analogous labels. The magnetic junction 200" includes a first pinned layer 210 having a magnetic moment 211, a first nonmagnetic spacer layer 220, a free layer 230 having magnetic moment 231, a second nonmagnetic spacer layer 240, an optional PEL 250 and a second pinned layer 260' that are analogous to the pinned layer 210, the first nonmagnetic spacer layer 220, the free layer 230 having magnetic moment 231, the second nonmagnetic spacer layer 240, optional PEL 250 and the second pinned layer 260 having magnetic moment 261 depicted in the magnetic junction 200. Also shown are an underlying substrate 201, bottom contact 202, top contact 208, optional seed layer(s) 204 and optional capping layer(s) 206 that are analogous to the substrate 201, bottom contact 202, top contact 208, optional seed layer(s) 204 and optional capping layer(s) 206 for the magnetic junction 200. Optional pinning layer(s) (not shown) may be used to fix the magnetization (not shown) of the pinned layer(s) 210 and/or 260. In some embodiments, the optional pinning layer may be an AFM layer or multilayer that pins the magnetization (not shown) of the pinned layer 210/260 by an exchange-bias interaction. However, in other embodiments, the optional pinning layer may be omitted or another structure may be used.

The perpendicular magnetic anisotropy energies of the pinned layers 210 and 260 and of the free layer 230 each exceeds the out of plane demagnetization energies of the pinned layers 210 and 260 and free layer 230, respectively. Consequently, the magnetic moments 231 and 211 of the free layer 230 and the pinned layer 210, respectively, may be perpendicular to plane. In addition, the second pinned layer 260' is a SAF including ferromagnetic layers 262 and 266 separated by a nonmagnetic layer 264, such as Ru. The perpendicular magnetic anisotropies of the ferromagnetic layers 262 and 266 exceeds their out-of-plane demagnetization energies. Thus, the magnetic moments 263 and 267 are depicted as perpendicular-to-plane. The magnetic junction 200 is also configured to allow the free layer 230 to be switched between stable magnetic states when a write current is passed through the magnetic junction 200. Thus, the free layer 230 is switchable utilizing spin transfer torque.

The dual magnetic junction 200" may have improved performance. In particular, the dual magnetic junction 200" may share the benefits of the magnetic junctions 200 and/or 200'. A higher anneal temperature may be used and/or different materials may be used for the second pinned layer 260. As a result, a higher magnetoresistance may be achieved. The use of Co, Fe, and Tb in the pinned layer 260' may reduce the stray fields on the free layer 230. Because the dual magnetic junction 200" is in the dual state, a lower write current may also be used. Thus, performance of the magnetic junction 200" may be improved.

Figure 6:
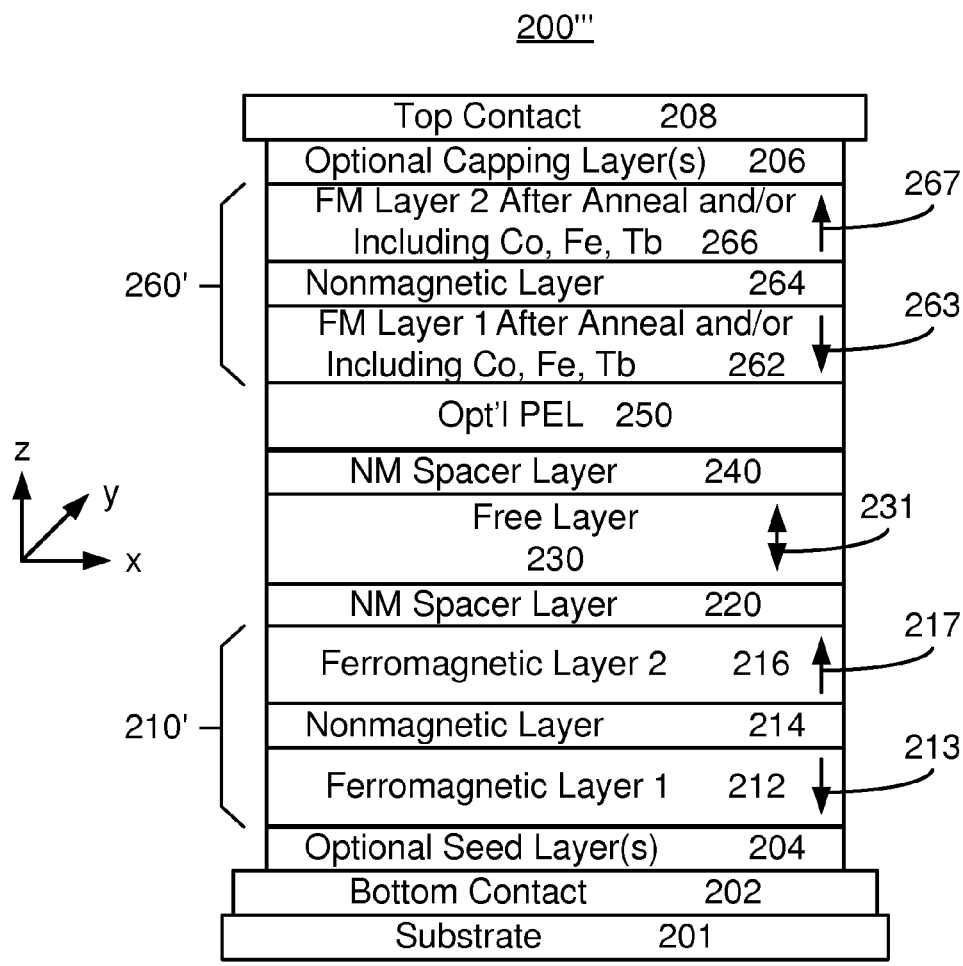
FIG. 6 depicts another exemplary embodiment of a dual magnetic junction usable in a magnetic memory programmable using spin transfer torque.

FIG. 6 depicts an exemplary embodiment of a magnetic junction 200''' that may be fabricated using the method 100, as well as surrounding structures. For clarity, FIG. 6 is not to scale. The magnetic junction 200''' may be used in a magnetic device such as a STT-RAM and, therefore, in a variety of electronic devices. The magnetic junction 200''' is analogous to the magnetic junction(s) 200, 200' and/or 200". Consequently, similar components have analogous labels. The magnetic junction 200''' includes a first pinned layer 210', a first nonmagnetic spacer layer 220, a free layer 230 having magnetic moment 231, a second nonmagnetic spacer layer 240, an optional PEL 250 and a second pinned layer 260' that are analogous to the pinned layer 210, the first nonmagnetic spacer layer 220, the free layer 230 having magnetic moment 231, the second nonmagnetic spacer layer 240, optional PEL 250 and the second pinned layer 260 having magnetic moment 261 depicted in the magnetic junction 200. Also shown are an underlying substrate 201, bottom contact 202, top contact 208, optional seed layer(s) 204 and optional capping layer(s) 206 that are analogous to the substrate 201, bottom contact 202, top contact 208, optional seed layer(s) 204 and optional capping layer(s) 206 for the magnetic junction 200. Optional pinning layer(s) (not shown) may be used to fix the magnetization (not shown) of the pinned layer(s) 210' and/or 260'. In some embodiments, the optional pinning layer may be an AFM layer or multilayer that pins the magnetization (not shown) of the pinned layer 210'/260' by an exchange-bias interaction. However, in other embodiments, the optional pinning layer may be omitted or another structure may be used.

The pinned layers 210' and 260' are both SAFs. Thus, the pinned layer 210' includes ferromagnetic layers 212 and 216 separated by nonmagnetic layer 214. The ferromagnetic layers 212 and 216 thus have magnetic moments 213 and 217, respectively that are aligned antiparallel. Similarly, the pinned layer 260' includes ferromagnetic layers 262 and 266 separated by nonmagnetic layer 264. The ferromagnetic layers 262 and 266 thus have magnetic moments 263 and 267, respectively, that are aligned antiparallel.

The dual magnetic junction 200''' may have improved performance. In particular, the dual magnetic junction 200''' may share the benefits of the magnetic junctions 200, 200' and/or 200''. A higher anneal temperature may be used and/or different materials may be used for the second pinned layer 260'. As a result, a higher magnetoresistance may be achieved. The use of Co, Fe, and Tb in the pinned layer 260' may reduce the stray fields on the free layer 230. Because the dual magnetic junction 200''' is in the dual state, a lower write current may also be used. Thus, performance of the magnetic junction 200''' may be improved.

Figure 7:
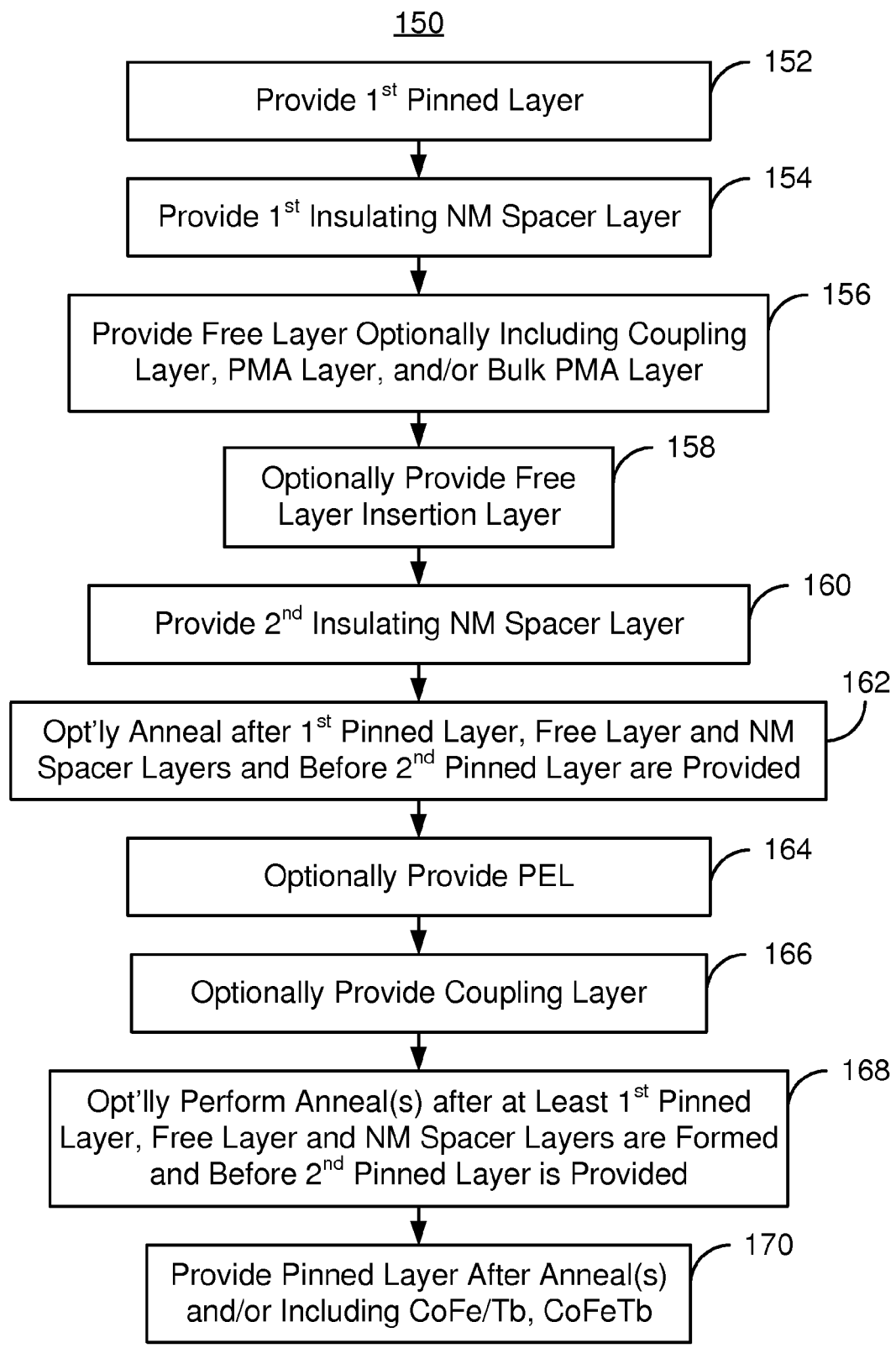
FIG. 7 depicts another exemplary embodiment of a method for providing a dual magnetic junction usable in a magnetic memory and programmable using spin transfer torque.

FIG. 7 depicts an exemplary embodiment of a method 150 for fabricating a magnetic junction usable in a magnetic device such as a STT-RAM and, therefore, in a variety of electronic devices. For simplicity, some steps may be omitted, performed in another or combined. Further, the method 150 may start after other steps in forming a magnetic memory have been performed. Portions of the method 150 are analogous to the method 100. For example, the method 150 may be performed after seed layer(s) and contact(s) are provided. Capping layer(s) and a top contact may also be provided.

A first pinned layer is provided on the substrate, via step 152. In some embodiments, step 152 is analogous to step 102 of the method 100. The first pinned layer formed in step 152 may be a simple layer or may include multiple layers. A first insulating nonmagnetic spacer layer is provided, via step 154. Step 154 is analogous to step 104. Step 154 may include providing MgO, which forms a tunneling barrier layer.

A free layer is provided on the substrate, via step 156. Step 156 may be analogous to step 106. In some embodiments, step 106 includes depositing the material(s) for the free layer on the nonmagnetic spacer layer provided in step 154. The perpendicular magnetic anisotropy energy of the free layer provided in step 156 may exceed the out-of-plane demagnetization energy. In addition, a PEL may be provided as part of or in addition to the free layer. Materials deposited in step 156 may include Fe, Co, Ni, Ru, W and/or other material(s). For example, step 156 may include providing W/CoFeB bilayer(s), Ta/CoFeB bilayer(s), CoFeB/W/CoFeB trilayer(s). These multilayers may also be repeated. In other embodiments, the free layer may include one or more of a CoFeB/W/CoFeB multilayer, a CoFeB/Ta/CoFeB multilayer, a CoFeB/Hf/CoFeB multilayer, a CoFeB/V/CoFeB multilayer, a CoFeB/W/Fe/W/CoFeB multilayer, a CoFeB/(CoFeTb)$_i$/CoFeB multilayer where i is an integer of at least one, A CoFeB/(CoFeGe)$_j$/CoFeB multilayer where j is an integer of at least one, and a Co/FeB/(CoFeGd)$_n$/CoFeB multilayer where n is an integer of at least one. Thus, the free layer may include materials, such as CoFeB, which have a high I-PMA. The free layer provided in step 106 may also include materials such as Ge, Gd and/or Tb multilayers and alloys which have a high B-PMA. In some embodiments, the free layer may include both high I-PMA and high B-PMA materials. For example, high I-PMA layers may be interleaved with the B-PMA layers. In some embodiments, the high B-PMA material(s) may be amorphous as-deposited. This may facilitate growth of a second nonmagnetic spacer layer, such as crystalline MgO, as discussed below. The free layer provided in step 156 is also configured to be switched between stable magnetic states when a write current is passed through the magnetic junction. Thus, the free layer is switchable utilizing spin transfer torque.

An insertion layer, such as Fe or W may also be provided, via step 158. A second nonmagnetic spacer layer is provided, via step 160. Step 160 is analogous to step 108. Step 160 may include depositing MgO, which forms a tunneling barrier layer.

The portion of the magnetic junction that has already been formed may optionally be annealed at a temperature of at least three hundred fifty degrees Celsius, via step 162. Step 162 may be performed before or after step 164 and before or after 166. Further, the anneal may be broken into multiple steps. Consequently, two anneals 162 and 168 are shown. Step 162 may be analogous to step 112. In some embodiments, other temperatures may be used.

A PEL may optionally be provided, via step 164. Step 164 is analogous to step 110. For example, step 164 may include providing CoFeB, FeB, a bilayer including a Fe layer and a CoFeB layer, a Fe/FeB bilayer, a CoFeBTa/CoFeB bilayer, and a CoFeB/W/Fe/W/CoFeB multilayer, a half metallic material and/or a Heusler alloy. A coupling layer, for example including Fe and/or W may be provided, via step 166.

The portion of the magnetic junction that has already been formed may optionally be annealed at a temperature of at least three hundred fifty degrees Celsius, via step 168. Step 168 may be performed before or after step 164 and before or after 166. Further, the anneal may be broken into multiple steps. Consequently, two anneals 162 and 168 are shown. Step 168 may be analogous to step 112. In some embodiments, other temperatures may be used. Step 168 may also be performed after step 170 is performed A second pinned layer is provided, optionally after the annealing step, via step 170. Step 170 is analogous to step 114. Step 114 may include depositing magnetic material(s) such as Co, Ni, and Fe as well as nonmagnetic materials. The second pinned layer formed in step 170 may be a simple (single) layer or may include multiple layers. For example, the second pinned layer formed in step 170 may be a SAF including magnetic layers antiferromagnetically or ferromagnetically coupled through thin nonmagnetic layer(s), such as Ru. In such a SAF, each magnetic layer may also include multiple layers. The second pinned layer may also be another multilayer. In some embodiments, Co/Pd multilayer(s), Co/Pt multilayer(s), CoPt alloys, Fe/Pt multilayer(s), Tb/CoFe multilayer(s), TbCoFe alloy(s) Co/Ni multilayer(s), CoFeB and/or other materials may be provided in step 170.

Fabrication of the magnetic junction may then be completed. For example, if steps 152-170 included deposition of the layers, then the layers may be masked and the magnetic junctions defined. Further, formation of other components for the device in which the magnetic junction is to be used may be completed.

Figure 8:
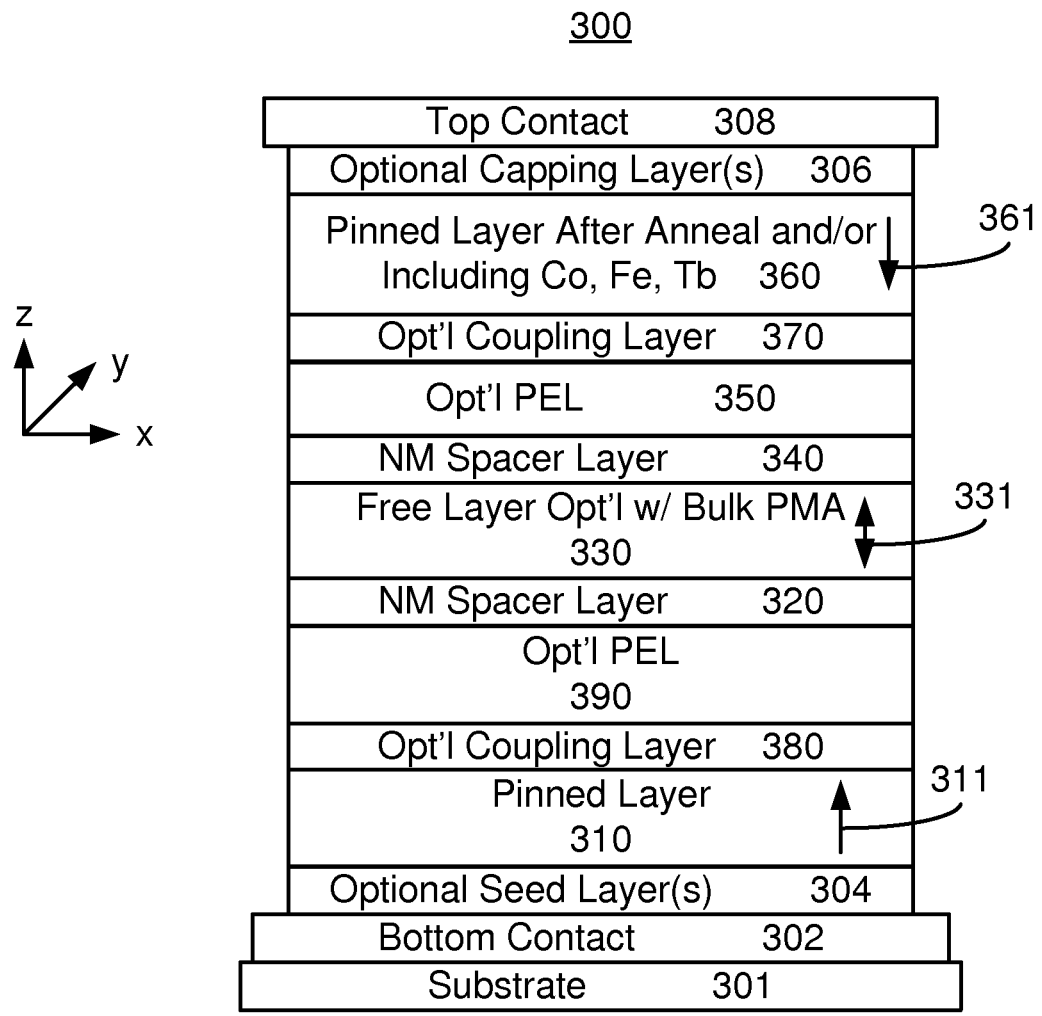
FIG. 8 depicts an exemplary embodiment of a dual magnetic junction usable in a magnetic memory programmable using spin transfer torque.

FIG. 8 depicts an exemplary embodiment of a magnetic junction 300 that may be fabricated using the method 150, as well as surrounding structures. For clarity, FIG. 8 is not to scale. The magnetic junction 300 may be used in a magnetic device such as a STT-RAM and, therefore, in a variety of electronic devices. The magnetic junction 300 is analogous to the magnetic junction(s) 200, 200', 200" and/or 200'". Consequently, similar components have analogous labels. The magnetic junction 300 includes pinned layer 310, a first nonmagnetic spacer layer 320, a free layer 330, a second nonmagnetic spacer layer 340, an optional PEL 350, and a second pinned layer 360 that are analogous to the pinned layer 210/210', the nonmagnetic spacer layer 220, the free layer 230, the nonmagnetic spacer layer 240, the PEL 250 and the pinned layer 260/260' depicted in the magnetic junctions 200, 200', 200" and 200'". Also shown are an underlying substrate 301, bottom contact 302, top contact 308, optional seed layer(s) 304 and optional capping layer(s) 306 that are analogous to the substrate 201, bottom contact 202, top contact 208, optional seed layer(s) 204 and optional capping layer(s) 206 for the magnetic junctions 200, 200', 200" and 200'". Also shown are optional coupling layer 380, optional PEL 390 that is analogous to the optional PEL 350 and the optional coupling layer 370.

As can be seen in FIG. 8, the second pinned layer 360 is closer to the top (furthest from a substrate 301) of the magnetic junction 300, and may be formed after an anneal. Further, the second pinned layer 360 may include Co, Fe, and Tb. For example, the pinned layer 260 may include CoFe/Tb bilayer or a CoFeTb alloy. The pinned layer(s) 310 and 360 may also include materials such as Co/Pt bilayer(s), CoPd bilayer(s), CoFeB and analogous high perpendicular magnetic anisotropy structures. One or more of the layers 310, 330 and/or 360 may also be multilayers including but not limited to SAFs.

The PEL 350 and/or 310 may include one or more of CoFeB, FeB, a bilayer including a Fe layer and a CoFeB layer, a Fe/FeB bilayer, a CoFeBTa/CoFeB bilayer, and a CoFeB/W/Fe/W/CoFeB multilayer, a half metallic material and a Heusler alloy.

In some embodiments, the free layer 330 may include amorphous B-PMA material(s) and/or an I-PMA material(s). Use of bulk PMA material(s) in the free layer 330 also enhance the perpendicular magnetic anisotropy of the free layer 330. For example, the free layer may include at least one of a CoFeB/W/CoFeB multilayer, a CoFeB/Ta/CoFeB multilayer, a CoFeB/Hf/CoFeB multilayer, a CoFeB/V/CoFeB multilayer, a CoFeB/W/Fe/W/CoFeB multilayer, a CoFeB/(CoFeTb)$_i$/CoFeB multilayer where i is an integer of at least one, A CoFeB/(CoFeGe)$_j$/CoFeB multilayer where j is an integer of at least one, a Co/FeB/(CoFeGd)$_n$/CoFeB multilayer where n is an integer of at least one. The magnetic junction 300 is also configured to allow the free layer 330 to be switched between stable magnetic states when a write current is passed through the magnetic junction 200. Thus, the free layer 230 is switchable utilizing spin transfer torque.

The magnetic junction 300 may have improved performance. Because an anneal may be performed in step 168 before the second pinned layer is provided in step 170, a higher anneal temperature may be used. As a result, the nonmagnetic spacer layers 320 and 340 may be better crystallized and have a texture more highly oriented in the desired direction. For example, improved crystalline MgO nonmagnetic spacer layers 320 and/or 340 may have more of the films oriented in the 200 direction. Consequently, a higher magnetoresistance may be achieved. Further, the selection of materials for the pinned layer 360 may be broadened. Thus, materials that may be adversely affected by a higher temperature anneal may be used for the second pinned layer 360. Again, TMR may be enhanced. Co, Fe and Tb may also be used in the pinned layer(s) 360 and/or 310. Thus, smaller stray fields from the pinned layer 360 and/or 310 may exert a smaller field on the free layer 330. In addition, the dual magnetic junction 300 may have the magnetic moments 311 and 361 in the dual state (antiparallel) as shown in FIG. 8. For such an embodiment, the spin transfer torque is enhanced. As a result, a lower write current may be used to program the dual magnetic junction 300. Thus, power consumption in a memory using the magnetic junction 300 may be reduced.

Figure 9:
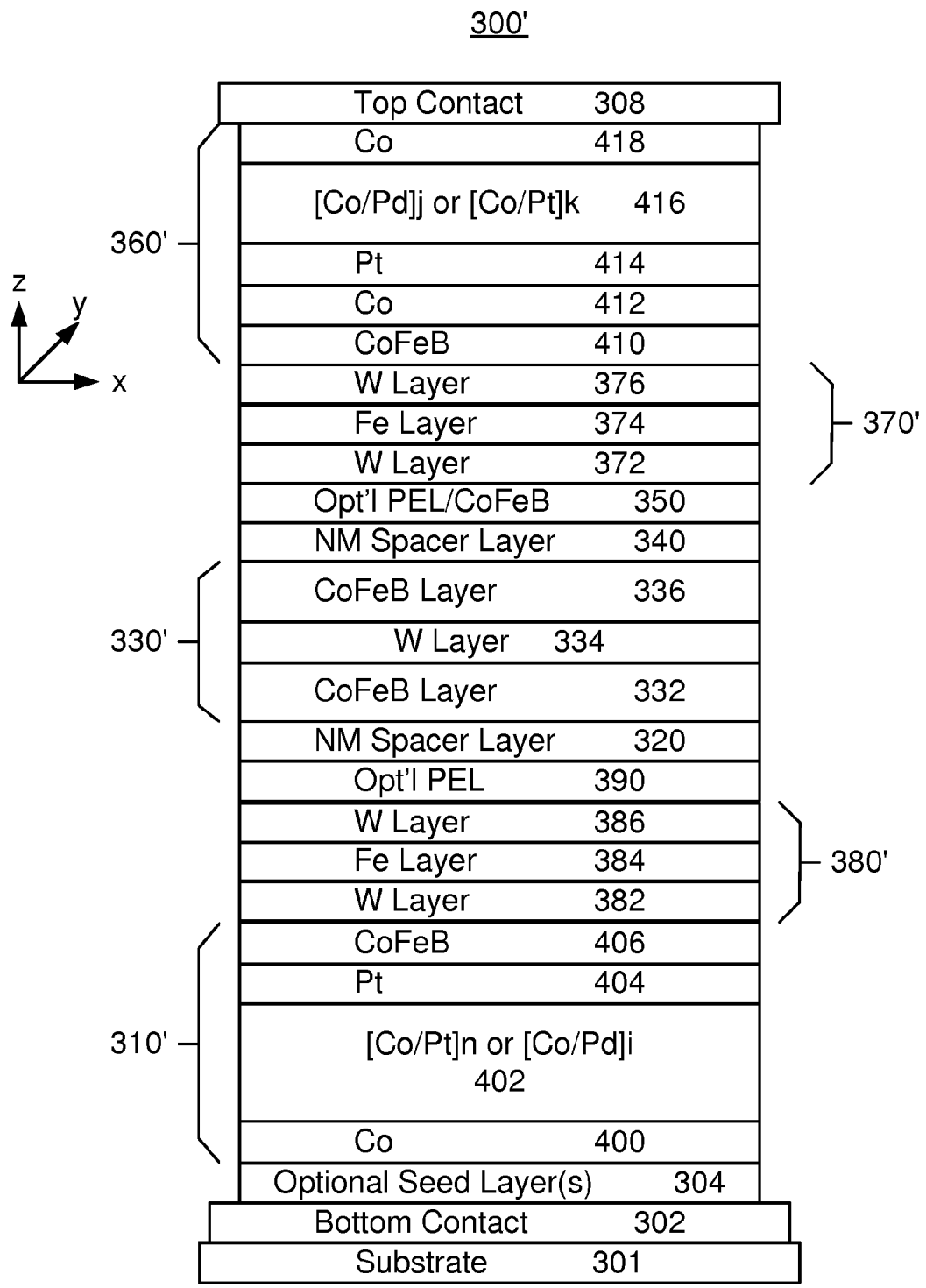
FIG. 9 depicts another exemplary embodiment of a dual magnetic junction usable in a magnetic memory programmable using spin transfer torque.

FIG. 9 depicts an exemplary embodiment of a magnetic junction 300' that may be fabricated using the method 150, as well as surrounding structures. For clarity, FIG. 9 is not to scale. The magnetic junction 300' may be used in a magnetic device such as a STT-RAM and, therefore, in a variety of electronic devices. The magnetic junction 300' is analogous to the magnetic junction 300. Consequently, similar components have analogous labels. The magnetic junction 300' includes a first pinned layer 310', a coupling layer 380', an optional PEL 390, a first nonmagnetic spacer layer 320, a free layer 330', a second nonmagnetic spacer layer 340, an optional PEL 350, a coupling layer 370', and a second pinned layer 360' that are analogous to the pinned layer 310, the coupling layer 380, the PEL 390, the first nonmagnetic spacer layer 320, the free layer 330, the second nonmagnetic spacer layer 340, optional PEL 350, the coupling layer 370 and the second pinned layer 360, respectively, depicted in the magnetic junction 300. Also shown is an underlying substrate 301, bottom contact 302, top contact 308, optional seed layer(s) 304 and optional capping layer(s) 306 that are analogous to the substrate 301, bottom contact 302, top contact 308, optional seed layer(s) 304 and optional capping layer(s) 306 for the magnetic junction 300. Optional pinning layer(s) (not shown) may be used to fix the magnetization (not shown) of the pinned layer(s) 310' and/or 360'.

The pinned layer 310' includes a Co layer 400, a Co/Pt or Co/Pd bilayer 402, a Pt layer 404 and a CoFeB layer 406. For example, the Co layer 400 may be 3.5 Angstroms, the bilayer 402 may be 1.8 Angstroms of Co and 1.5 Angstroms of Pt with four repeats, the Pt layer 404 may be two Angstroms thick, the CoFeB layer 406 may be four Angstroms thick. The coupling layer 380' may include W layers 382 and 386 separated by Fe layer 384. In some embodiments, the W layers 382 and 386 may be two Angstroms thick while the Fe layer 384 may be six Angstroms thick.

The free layer may include CoFeB layers 332 and 336 separated by a W layer 334. The CoFeB layers 332 and 336 may be twelve and 5.5 Angstroms thick, respectively. The W layer 334 may be two Angstroms thick.

The coupling layer 370' may include W layers 372 and 376 separated by Fe layer 374. In some embodiments, the W layers 372 and 376 may be two Angstroms thick while the Fe layer 374 may be six Angstroms thick.

The pinned layer 360' includes a CoFeB layer 410, Co layer 412, Pt layer 414, a Co/Pt bilayer having k repeats or a Co/Pd bilayer having j repeats in layer 416, and a Co layer 418. Further, the pinned layer 360' is provided after the anneal of the underlying layers. For example, the Co layer 412 may be 3.5 Angstroms, the bilayer 416 may be 2.5 Angstroms of Co and 10 Angstroms of Pt with four repeats, the Pt layer 414 may be ten Angstroms thick, the CoFeB layer 410 may be four Angstroms thick and the CO layer 418 may be five Angstroms thick. The perpendicular magnetic anisotropy energies of the pinned layers 310' and 360' and of the free layer 330' each exceeds their out of plane demagnetization energies. The magnetic junction 300' is also configured to allow the free layer 330' to be switched between stable magnetic states when a write current is passed through the magnetic junction 300'. Thus, the free layer 330' is switchable utilizing spin transfer torque.

The dual magnetic junction 300' may have improved performance. In particular, the dual magnetic junction 300' may share the benefits of the magnetic junction 300. Because the anneal(s) are performed in step(s) 162 and/or 168 before the second pinned layer is provided in step 170, a higher anneal temperature may be used. As a result, the nonmagnetic spacer layers 320 and 340 may be better crystallized and have a texture more highly oriented in the desired direction. Consequently, a higher magnetoresistance may be achieved. Further, the selection of materials for the pinned layer 360' may be broadened. TMR may thus be enhanced. In addition, the dual magnetic junction 300' may have the magnetic moments of the layers 310' and 360' in the dual state (antiparallel). For such an embodiment, the spin transfer torque is enhanced. As a result, a lower write current may be used to program the dual magnetic junction 300'. Thus, power consumption in a memory using the magnetic junction 300' may be reduced.

Figure 10:
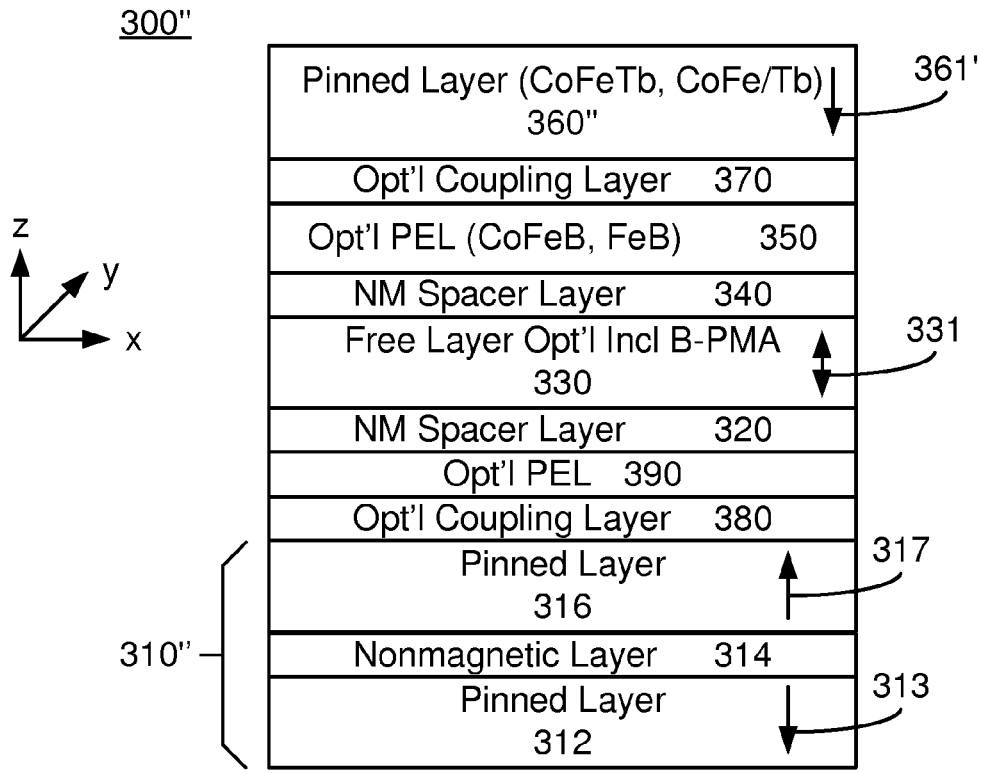
FIG. 10 depicts another exemplary embodiment of a dual magnetic junction usable in a magnetic memory programmable using spin transfer torque.

FIG. 10 depicts an exemplary embodiment of a magnetic junction 300" that may be fabricated using the method 150, as well as surrounding structures. For clarity, FIG. 10 is not to scale. The magnetic junction 300" may be used in a magnetic device such as a STT-RAM and, therefore, in a variety of electronic devices. The magnetic junction 300" is analogous to the magnetic junction(s) 300 and/or 300'. Consequently, similar components have analogous labels. The magnetic junction 300" includes a first pinned layer 310", a coupling layer 380, an optional PEL 390, a first nonmagnetic spacer layer 320, a free layer 330 having magnetic moment 331, a second nonmagnetic spacer layer 340, an optional PEL 350, a coupling layer 370, and a second pinned layer 360" that are analogous to the pinned layer 310/310', the coupling layer 380/380', the PEL 390, the first nonmagnetic spacer layer 320, the free layer 330/330', the second nonmagnetic spacer layer 340, optional PEL 350, the coupling layer 370/370' and the second pinned layer 360/360', respectively, depicted in the magnetic junctions 300 and 300'. For simplicity, the underlying substrate, bottom contact, top contact, optional seed layer(s) and optional capping layer(s) that are analogous to the substrate 301, bottom contact 302, top contact 308, optional seed layer(s) 304 and optional capping layer(s) 306 for the magnetic junction 300 are not shown. Optional pinning layer(s) (not shown) may be used to fix the magnetization (not shown) of the pinned layer(s) 310" and/or 360".

The pinned layer 310" is a SAF including magnetic layers 312 and 316 separated by a nonmagnetic layer 314 that may be Ru. The magnetic moments 313 and 317 are, therefore, antiparallel. The free layer 330 may include amorphous B-PMA material( ), such as a CoFeB/W/CoFeB multilayer, a CoFeB/Ta/CoFeB multilayer, a CoFeB/Hf/CoFeB multilayer, a CoFeB/V/CoFeB multilayer, a CoFeB/W/Fe/W/CoFeB multilayer, a CoFeB/(CoFeTb)$_i$/CoFeB multilayer where i is an integer of at least one, A CoFeB/(CoFeGe)$_j$/CoFeB multilayer where j is an integer of at least one, and/or a Co/FeB/(CoFeGd)$_n$/CoFeB multilayer where n is an integer of at least one. Use of a B-PMA material allows for a thicker free layer 330" without sacrificing high PMA. Further, the pinned layer 360" includes a CoFeTb alloy or a CoFe/Tb bilayer. The anneal may be performed before or after formation of the pinned layer 360".

The magnetic junction 300" may have improved performance. If anneal(s) are performed before the second pinned layer 360" is provided, a higher anneal temperature may be used. As a result, the nonmagnetic spacer layers 320 and 340 may be better crystallized and have a texture more highly oriented in the desired direction. For example, improved crystalline MgO nonmagnetic spacer layers 320 and/or 340 may have more of the films oriented in the 200 direction. Consequently, a higher magnetoresistance may be achieved. Use of bulk PMA material(s) in the free layer 330 also enhance the perpendicular magnetic anisotropy of the free layer 330. Co, Fe and Tb may also be used in the pinned layer 360". Thus, smaller stray fields from the pinned layer 360" may exert a smaller field on the free layer 330. This may also be true if CoFeTb or CoFe/Tb are used for the pinned layer 310". In addition, the dual magnetic junction 300" may have the magnetic moments 361' and 317 in the dual state (antiparallel) as shown in FIG. 10. For such an embodiment, the spin transfer torque is enhanced. As a result, a lower write current may be used to program the dual magnetic junction 300". Thus, power consumption in a memory using the magnetic junction 300" may be reduced.

Figure 11:
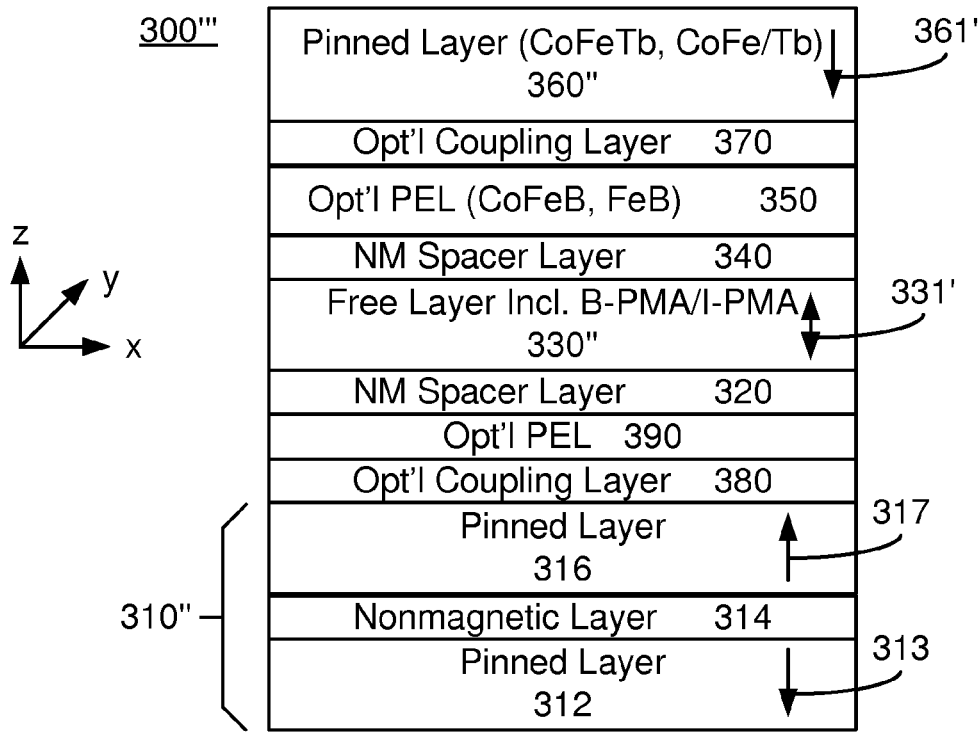
FIG. 11 depicts another exemplary embodiment of a dual magnetic junction usable in a magnetic memory programmable using spin transfer torque.

FIG. 11 depicts an exemplary embodiment of a magnetic junction 300''' that may be fabricated using the method 150, as well as surrounding structures. For clarity, FIG. 11 is not to scale. The magnetic junction 300''' may be used in a magnetic device such as a STT-RAM and, therefore, in a variety of electronic devices. The magnetic junction 300''' is analogous to the magnetic junction(s) 300, 300' and/or 300". Consequently, similar components have analogous labels. The magnetic junction 300''' includes a first pinned layer 310", a coupling layer 380, an optional PEL 390, a first nonmagnetic spacer layer 320, a free layer 330" having magnetic moment 331', a second nonmagnetic spacer layer 340, an optional PEL 350, a coupling layer 370, and a second pinned layer 360" that are analogous to the pinned layer 310/310', the coupling layer 380/380', the PEL 390, the first nonmagnetic spacer layer 320, the free layer 330/330', the second nonmagnetic spacer layer 340, optional PEL 350, the coupling layer 370/370' and the second pinned layer 360/360', respectively, depicted in the magnetic junctions 300, 300' and 300". For simplicity, the underlying substrate, bottom contact, top contact, optional seed layer(s) and optional capping layer(s) are not shown. Optional pinning layer(s) (not shown) may be used to fix the magnetization (not shown) of the pinned layer(s) 310" and/or 360".

The free layer 330" includes both amorphous B-PMA material(s) and I-PMA material(s). For example, one or more B-PMA layer(s) may be alternated with I-PMA layers. Coupling layer may also be provided between the ferromagnetic layers. The anneal of step 168 may be performed before or after formation of the pinned layer 360".

The magnetic junction 300''' may have improved performance. If anneal(s) are performed before the second pinned layer 360" is provided, a higher anneal temperature may be used. As a result, the nonmagnetic spacer layers 320 and 340 may be better crystallized and have a texture more highly oriented in the desired direction. Consequently, a higher magnetoresistance may be achieved. Use of B-PMA and I-PMA material(s) in the free layer 330" also enhance the perpendicular magnetic anisotropy of the free layer 330. Co, Fe and Tb may also be used in the pinned layer 360". Thus, smaller stray fields from the pinned layer 360" may exert a smaller field on the free layer 330. This may also be true if CoFeTb or CoFe/Tb are used for the pinned layer 310". In addition, the dual magnetic junction 300''' may have the magnetic moments 361' and 317 in the dual state (antiparallel) as shown in FIG. 11. For such an embodiment, the spin transfer torque is enhanced. As a result, a lower write current may be used to program the dual magnetic junction 300'''. Thus, power consumption in a memory using the magnetic junction 300''' may be reduced.

Figure 12:
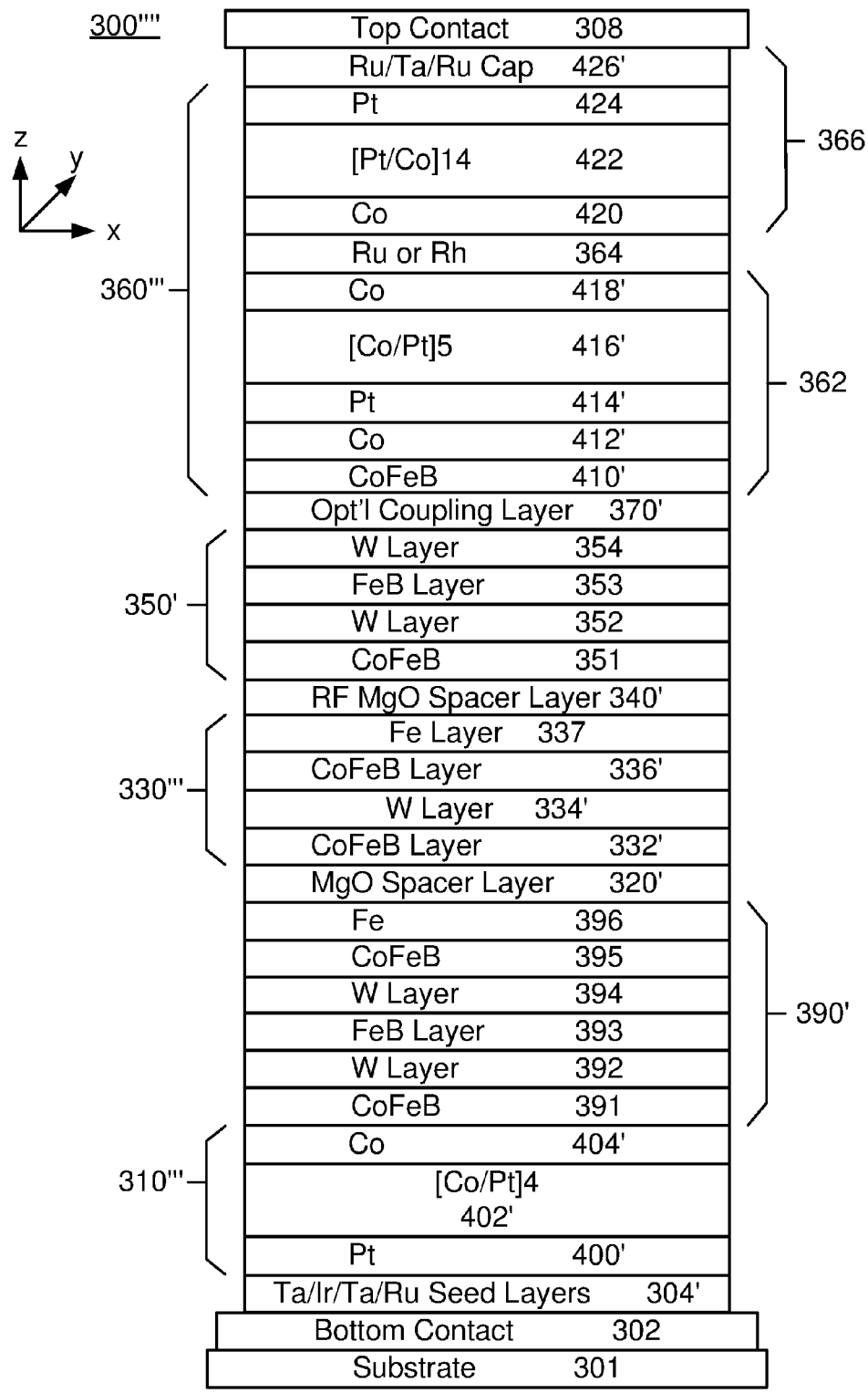
FIG. 12 depicts another exemplary embodiment of a dual magnetic junction usable in a magnetic memory programmable using spin transfer torque.

FIG. 12 depicts an exemplary embodiment of a magnetic junction 300'''' that may be fabricated using the method 150, as well as surrounding structures. For clarity, FIG. 12 is not to scale. The magnetic junction 300'''' may be used in a magnetic device such as a STT-RAM and, therefore, in a variety of electronic devices. The magnetic junction 300'''' is analogous to the magnetic junction(s) 300, 300', 300" and/or 300'''. Consequently, similar components have analogous labels. The magnetic junction 300'''' includes a first pinned layer 310''', an optional PEL 390', a first nonmagnetic spacer layer 320', a free layer 330''' having magnetic moment (not shown in FIG. 12), a second nonmagnetic spacer layer 340', another optional PEL 350', an optional coupling layer 370", and a second pinned layer 360''' that are analogous to the pinned layer 310"/310'/310", the PEL 390, the first nonmagnetic spacer layer 320, the free layer 330/330'/330", the second nonmagnetic spacer layer 340, optional PEL 350, and the second pinned layer 360/360'/360", respectively, depicted in the magnetic junctions 300, 300', 300" and 300'''. Optional pinning layer(s) (not shown) may be used to fix the magnetization (not shown) of the pinned layer(s) 310" and/or 360".

The magnetic junction 300'''' may be considered to be a specific implementation of the method 150 and the magnetic junction 300. The seed layer 304' includes from closest to the substrate 301 to closest to the pinned layer 310': ten Angstroms of Ta, five hundred Angstroms of Ir, ten Angstroms of Ta and fifty Angstroms of Ru (a Ta/Ir/Ta/Ru multilayer). The bottom pinned layer 310' includes a Pt layer 400' that is two Angstroms thick, a bilayer 402' of 1.8 Angstroms of Co and 1.5 Angstroms of Pt that is repeated four times, and a Co layer 404' having a thickness of 3.5 Angstroms. A bottom PEL 390' is also provided. The PEL 390' includes a CoFeB layer 391 having forty atomic percent of B, a W layer 392 that is two Angstroms thick, a FeB layer 393 having thirty atomic percent B and that is 4.5 Angstroms thick, a W layer 394 that is two Angstroms thick and a CoFeB layer 395 including twenty atomic percent of B and that is three Angstroms thick and an Fe layer 396 that is four Angstroms thick. In other embodiments, one or more of the layers 392, 393, 394, 395 and 396 might be considered separate from the PEL 390'. An MgO spacer layer 320' that is formed by RF deposition is also included in the junction 300''''. In some embodiments, the deposition is performed for 625 seconds to provide the desired RA and desired thickness on the order of at least five Angstroms and not more than eight Angstroms. In other embodiments, other times and thicknesses may be used. The free layer 330''' is a multilayer. In the embodiment shown, the free layer is formed of a CoFeB layer 332' including forty atomic percent B and having a thickness of six Angstroms, a W layer 334' having a thickness of two Angstroms, and a CoFeB layer 336' including having twenty percent B and having a thickness of least eight Angstroms and not more than twelve Angstroms and an additional Fe layer 337 that is four Angstroms thick. The nonmagnetic spacer layer 340' is an MgO layer formed by RF deposition of MgO for 920 seconds. A first heat treatment is performed after formation of the MgO barrier layer 340'. In some embodiments, the heat treatment is an RTA. In some embodiments, the RTA is performed for ninety seconds and at a temperature of approximately 450 degrees Celsius. Thus, an anneal is performed after formation of the tunneling barrier 320' but before formation of the PEL 350' and the second pinned layer 360'''. In other embodiments, other temperatures and/or times may be used.

The PEL 350' includes a multilayer including four layers. These layers include a layer 351 of thirteen Angstroms of CoFeB with twenty atomic percent B, a layer 352 of two Angstroms of W, a layer 353 of six Angstroms of FeB having thirty atomic percent B and another layer 354 of two Angstroms of W. In some embodiments, some portion of the layers of the PEL 350' may be considered to form a coupling layer.

Another RTA at a temperature of 400 degrees Celsius is performed after formation of the PEL 350', but before formation of the pinned layer 360'''. Thus, for the magnetic junction 300'''', multiple anneals are performed between the tunneling barrier layers 320' and 340' being deposited and the pinned layer 360''' being deposited. In other embodiments, other temperatures and/or times may be used.

The pinned layer 360''' is a SAF including two ferromagnetic multilayers 362 and 366 separated by a RuRh layer 364 that is 4.3 Angstroms thick in the embodiment shown. In other embodiments, other nonmagnetic materials such as Ru may be used. The first pinned layer 362 includes a four Angstrom layer 410' of CoFeB having forty atomic percent B, a 3.5 Angstrom layer 412' of Co, a ten Angstrom layer 414' of Pt and five repeats of a bilayer 416' that includes three Angstroms of Co (the first of which adjoins the Pt layer 414') and eight Angstroms of Pt. The multilayer 362 also includes another layer 418' of Co that is five Angstroms thick. The second pinned layer 366 includes a layer 420 of five Angstroms of Co and fourteen repeats of a bilayer 422 of eight Angstroms of Pt (the first of which adjoins the Co layer 420) and three Angstroms of Co. The second pinned layer 366 also includes another layer 424 of eight Angstroms of Pt. The capping layer 426' may be a multilayer that includes, from bottom (closest to the pinned layer 360''') to top: fifteen Angstroms of Ru, fifteen Angstroms of Ta and another forty Angstroms of Ru adjoining the top contact. Note that the thicknesses described for the magnetic junction 300'''' may be approximate or as-measured. However, other thicknesses, other repeats of bilayers, and other materials may be possible. For example, a CoPt alloy, Co/Pd multilayers and/or other analogous materials may be used in the layers 310', 362 and 366.

The dual magnetic junction 300'''' may have improved performance. The anneals are performed before the second pinned layer 360''' is provided, allowing for higher anneal temperature(s). As a result, the nonmagnetic spacer layers 320' and 340' may be better crystallized and have a texture more highly oriented in the desired direction. Consequently, a higher magnetoresistance may be achieved. Use of B-PMA and I-PMA material(s) in the free layer 330''' also enhance the perpendicular magnetic anisotropy of the free layer 330'''. In addition, the dual magnetic junction 300'''' may have the magnetic moments and in the dual state (antiparallel). For such an embodiment, the spin transfer torque is enhanced. As a result, a lower write current may be used to program the dual magnetic junction 300''''. Thus, power consumption in a memory using the magnetic junction 300'''' may be reduced.

Figure 13:
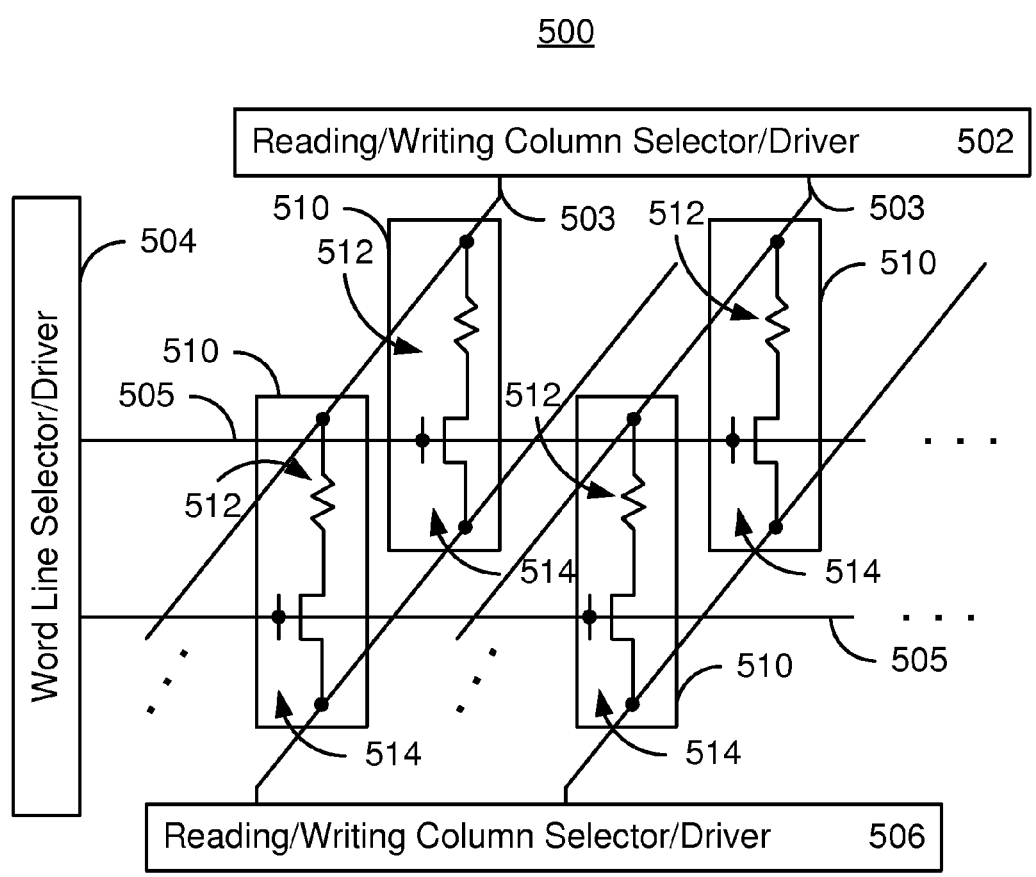
FIG. 13 depicts an exemplary embodiment of a memory utilizing magnetic junctions in the memory element(s) of the storage cell(s).

FIG. 13 depicts an exemplary embodiment of a memory 500 that may use one or more of the magnetic junctions 200, 200', 200", 200''', 300, 300', 300", 300''' and/or 300''''. The magnetic memory 500 includes reading/writing column select drivers 502 and 506 as well as word line select driver 504. Also shown are bit lines 503 and word lines 505. Note that other and/or different components may be provided. The storage region of the memory 500 includes magnetic storage cells 510. Each magnetic storage cell includes at least one magnetic junction 512 and at least one selection device 514. In some embodiments, the selection device 514 is a transistor. The magnetic junctions 512 may be one of the magnetic junctions 200, 200', 200", 200''', 300, 300', 300", 300''' and/or 300'''' disclosed herein. Although one magnetic junction 512 is shown per cell 510, in other embodiments, another number of magnetic junctions 512 may be provided per cell. As such, the magnetic memory 500 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a dual magnetic junction on a substrate usable in a magnetic device, the method comprising:
   providing a first pinned layer;
   providing a first nonmagnetic spacer layer, the first pinned layer being between the first nonmagnetic spacer layer and the substrate;
   providing a free layer, the first nonmagnetic spacer layer being between the free layer and the first pinned layer;
   providing a second nonmagnetic spacer layer, the free layer being between the first and second nonmagnetic spacer layer;
   providing at least one additional layer;
   annealing at least the first pinned layer, the first nonmagnetic spacer layer, the free layer, the second nonmagnetic spacer layer and at least a bottom layer of the at least one additional layer at a temperature of at least three hundred and fifty degrees Celsius; and
   providing a second pinned layer, the second nonmagnetic spacer layer residing between the second pinned layer and the free layer, the free layer being between the substrate and the second pinned layer, the at least one additional layer being between the second nonmagnetic spacer layer and the second pinned layer, the step of providing the second pinned layer including depositing the second pinned layer after the annealing step;
   wherein the magnetic junction is configured such that the free layer is switchable between a plurality of stable magnetic states when a write current is passed through the magnetic junction.

2. The method of claim 1 wherein at least one of the free layer, the first pinned layer and the second pinned layer has a perpendicular magnetic anisotropy energy greater than an out-of-plane demagnetization energy.

3. The method of claim 2 wherein the step of providing the at least one additional layer further includes:
   providing a polarization enhancement layer (PEL) between the second pinned layer and the second nonmagnetic spacer layer.

4. The method of claim 3 wherein the annealing step is performed after the step of providing the PEL.

5. The method of claim 3 wherein the PEL includes at least one of CoFeB, FeB, a bilayer including a Fe layer and a CoFeB layer, a Fe/FeB bilayer, a CoFeBTa/CoFeB bilayer, and a CoFeB/W/Fe/W/CoFeB multilayer, a half metallic material and a Heusler alloy.

6. The method of claim 3 further comprising:
   providing a coupling layer between the PEL and the second pinned layer.

7. The method of claim 1 wherein the step of providing the free layer further includes:
   providing at least one of a CoFeB/W/CoFeB multilayer, a CoFeB/Ta/CoFeB multilayer, a CoFeB/Hf/CoFeB multilayer, a CoFeB/V/CoFeB multilayer, a CoFeB/W/Fe/W/CoFeB multilayer, a CoFeB/(CoFeTb)$_i$/CoFeB multilayer where i is an integer of at least one, a CoFeB/(CoFeGe)$_j$/CoFeB multilayer where j is an integer of at least one, a Co/FeB/(CoFeGd)$_n$/CoFeB multilayer where n is an integer of at least one.

8. The method of claim 1 wherein the free layer includes at least one amorphous bulk perpendicular magnetic anisotropy material.

9. The method of claim 8 wherein the free layer includes at least one interfacial perpendicular magnetic anisotropy material adjoining the amorphous bulk perpendicular magnetic anisotropy material.

10. The method of claim 1 wherein at least one of the first pinned layer, the second pinned layer and the free layer is a synthetic antiferromagnetic including a plurality of ferromagnetic layers interleaved with at least one nonmagnetic layer.

11. The method of claim 1 wherein the second pinned layer temperature is less than three hundred and fifty degrees Celsius during fabrication.

12. The method of claim 1 wherein the second pinned layer includes at least one of a first combination of Co and Pd, a second combination of Co and Pt, a third combination of Fe and Pt, a fourth combination of Co and Ni, a fifth combination of Tb, Co and Fe and a sixth combination of Co, Fe and B.

13. The method of claim 11 wherein the second pinned layer includes at least one of a Co/Pd multilayer, a Co/Pt multilayer, a CoPt alloy, a Fe/Pt multilayer, a Tb/CoFe multilayer, a TbCoFe alloy, and a Co/Ni multilayer.

* * * * *